United States Patent [19]

Kumamoto et al.

[11] Patent Number: 5,554,989
[45] Date of Patent: Sep. 10, 1996

[54] A/D CONVERTER HAVING FOLDED ARRANGEMENT OF VOLTAGE COMPARATOR

[75] Inventors: Toshio Kumamoto; Takahiro Miki, both of Hyogo-ken, Japan

[73] Assignee: Mitsubishi Denki Kabushiki Kaisha, Tokyo, Japan

[21] Appl. No.: 241,422

[22] Filed: May 11, 1994

[30] Foreign Application Priority Data

Aug. 6, 1993 [JP] Japan ................................. 5-196001

[51] Int. Cl.$^6$ ........................................... H03M 1/36
[52] U.S. Cl. ................................................. 341/159
[58] Field of Search ................................ 341/156, 159

[56] References Cited

U.S. PATENT DOCUMENTS

| | | | |
|---|---|---|---|
| 4,559,522 | 12/1985 | Sekino et al. | 341/159 |
| 4,568,910 | 2/1986 | Sekino et al. | 341/159 |
| 4,635,036 | 1/1987 | Yoshizawa | 341/159 |
| 4,745,393 | 5/1988 | Tsukada et al. | 341/156 |
| 5,019,820 | 5/1991 | Matsuzawa et al. | 341/156 |
| 5,187,483 | 2/1993 | Yonemaru | 341/156 |
| 5,416,484 | 5/1995 | Lofstrom | 341/159 |

OTHER PUBLICATIONS

"1993 Symposium on VLSI Circuits", Digest of Technical Papers, May 19, 1993, Kyoto, Japan.

Primary Examiner—Marc S. Hoff
Attorney, Agent, or Firm—Lowe, Price, LeBlanc & Becker

[57] ABSTRACT

Voltage comparators $C_1$–$C_N$ for comparing a first differential reference voltage obtained by dividing a first reference voltage $V_{RT}$ and a second reference voltage $V_{RB}$ by ladder resistors $r_1$–$r_{N+1}$ and a second differential reference input voltage formed by a third voltage $V_i$ and a fourth voltage $V_i$ are arranged in first to N/2 and (N/2+1)-th to N-th voltage comparator rows in a folded manner and wiring area can be reduced as a result.

3 Claims, 4 Drawing Sheets

A/D CONVERTER HAVING FOLDED ARRANGEMENT OF VOLTAGE COMPARATOR

BACKGROUND OF THE INVENTION

1. Field of the Invention

The present invention relates generally to A/D converters. More specifically, the invention relates to an A/D converter having an improved arrangement of voltage comparators.

2. Description of the Background Art

FIG. 4 is a circuit diagram showing a conventional A/D converter. In FIG. 4, there are provided N voltage comparators $C_1, C_2, \ldots, C_N$, each of which includes first to fourth input terminals $T_1$–$T_4$ and an output connected to encoder 1. There are provided a ladder of N+1 resistors $r_1, r_2, \ldots, r_{N/2}, r_{N/2+1}, \ldots r_N$, and $r_{N+1}$ connected in series, one end of which is provided with a first reference voltage $V_{RT}$, and the other is provided with a second reference voltage $V_{RB}$. Intermediate taps are provided at connection points of ladder resistors $r_1, r_2 \ldots, r_{N/2}, r_{N/2+1}, \ldots, r_N$, and $r_{N+1}$.

The first terminal $T_1$ of voltage comparator $C_1$ is connected to a first intermediate tap which is a connection point between ladder resistors $r_1$ and $r_2$, and the second terminal $T_2$ of voltage comparator $C_1$ is connected to the N-th intermediate tap which is a connection point between ladder resistors $r_N$ and $r_{N+1}$. The first terminal $T_1$ of voltage comparator $C_2$ is connected to a second intermediate tap, and the second terminal $T_2$ is connected to the (N−1)-th intermediate tap. Similarly, voltage comparators $C_{N/2}$, $C_{N/2+1} \ldots, C_{N-1}$, and $C_N$ are each connected to a prescribed intermediate tap. The third terminals $T_3$ and fourth terminals $T_4$ of voltage comparators $C_1$–$C_N$ are connected together, each third terminal $T_3$ is provided with a positive side input voltage $V_i$ and each fourth terminal $T_4$ is provided with a negative side input voltage $\overline{V}_i$. Voltage comparators $C_1$–$C_N$ are each provided with a clock signal $\phi$.

Voltage comparators $C_1$–$C_N$ each compare differential input voltages $V_i$ and $\overline{V}_i$ input to third and fourth terminals $T_3$ and $T_4$, and a reference voltages input to first and second terminals $T_1$ and $T_2$. At the time, if an input voltage is larger than a differential voltage applied to the m-th voltage comparator, and smaller than a reference differential voltage applied to the (m+1)-th voltage comparator, the outputs of the first to m-th voltage comparators attain an "H" level, and the outputs of the (m+1)-th to the N-th voltage comparators attain an "L" level. Accordingly, in view of the output of each voltage comparators $C_1$–$C_N$, which differential reference voltage a differential input voltage is larger than can be known, and the larger differential input voltage is passed through encoder 1 for A/D conversion.

In an A/D converter using conventional differential comparators is configured as illustrated in FIG. 4, a large amount of wiring is necessary for applying the intermediate tap voltages of ladder resistors $r_1$–$r_{N+1}$ to voltage comparators $C_1$–$C_N$, resulting in increase of the area occupied by the chip.

SUMMARY OF THE INVENTION

It is therefore a primary object of the present invention to provide an A/D converter permitting efficient wiring for intermediate taps and reduction of the chip occupied area.

An A/D converter according to the invention includes a ladder of (N+1) resistors connected in series having first, second to N-th intermediate taps provided at respective connection points, one end of which is provided with a first reference voltage ($V_{RT}$) and the other with a second reference voltage ($V_{RB}$), and first, second to N-th voltage comparators for comparing a first differential reference voltage obtained by dividing first and second reference voltages using the ladder resistors and a second differential reference voltage formed by third and fourth voltages ($V_i, \overline{V}_i$). The first, second to N-th voltage comparators each include first to fourth input terminals, the first input terminals are connected to first, second to N-th intermediate taps, respectively, the second input terminals are connected to the N−1 to the first intermediate taps, respectively, and the third input terminals are connected together and provided with a third voltage, the fourth input terminals are connected together and provided with a fourth voltage, and the first to (N/2)-th voltage comparators and the (N/2+1)-th to N-th voltage comparators are arranged in two rows in a folded manner.

According to a preferred embodiment of the invention, first, second to N-th voltage comparators are separated in 2 n rows (n is a positive integer) and arranged in a folded manner.

A more preferred embodiment of the invention includes first and second semiconductor substrates, a ladder of resistors are arranged in the first semiconductor substrate, voltage comparators and a wiring pattern for supplying the third and fourth voltages are arranged in parallel in the second semiconductor substrate, and a wiring pattern for conducting the third and fourth voltages to the third and fourth input terminals of each voltage comparator, and a coupling electrode for coupling these patterns and intermediate taps for the ladder resistors on the first semiconductor substrate is formed.

Accordingly, in an A/D converter according to the invention, first to (N/2)-th voltage comparators and (N/2+1)-th to N-th voltage comparators are arranged in two rows in a folded manner, and therefore the area occupied by the wirings can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
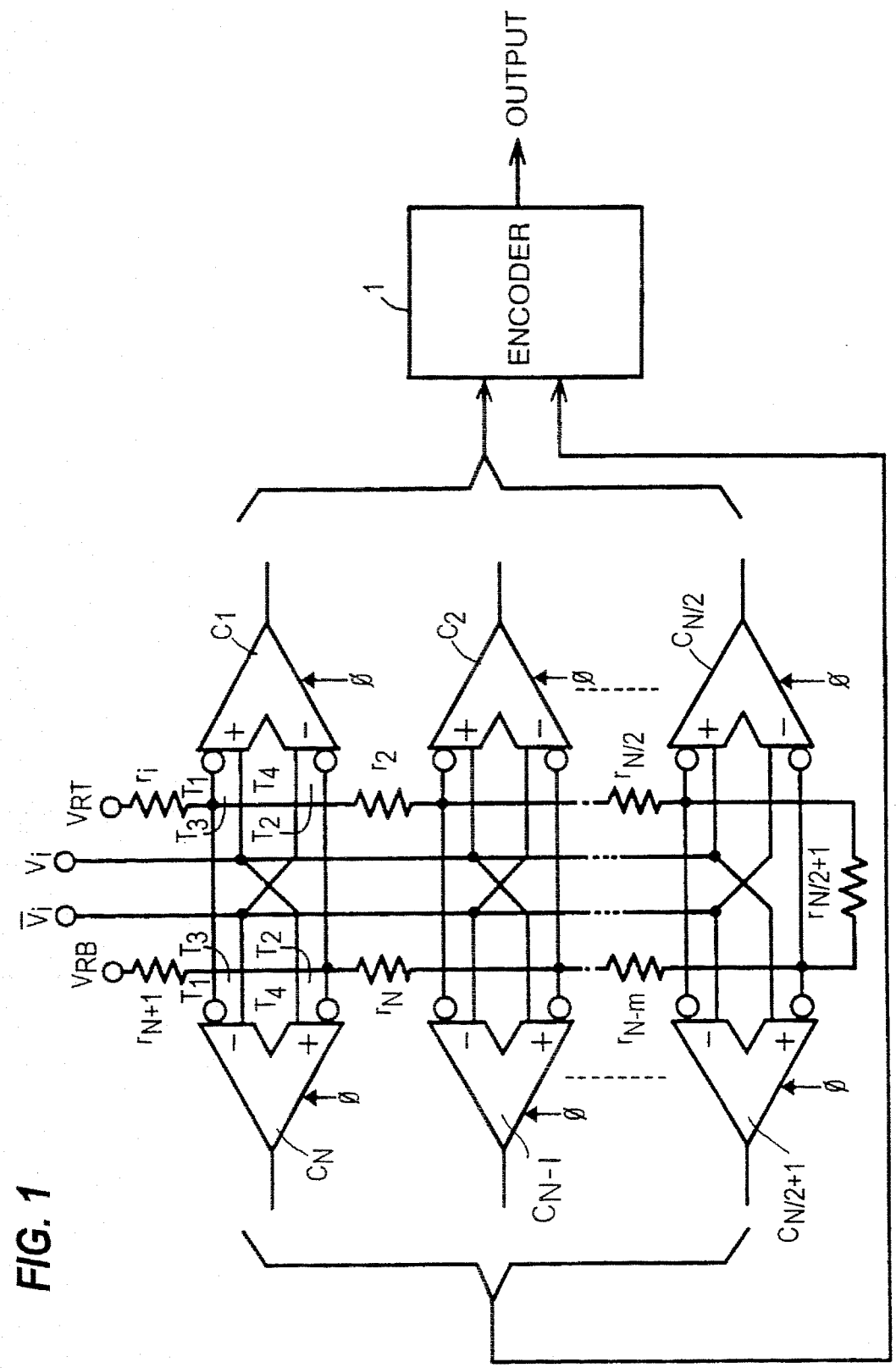
FIG. 1 is a circuit diagram showing an A/D converter according to one embodiment of the invention.
Figure 4:
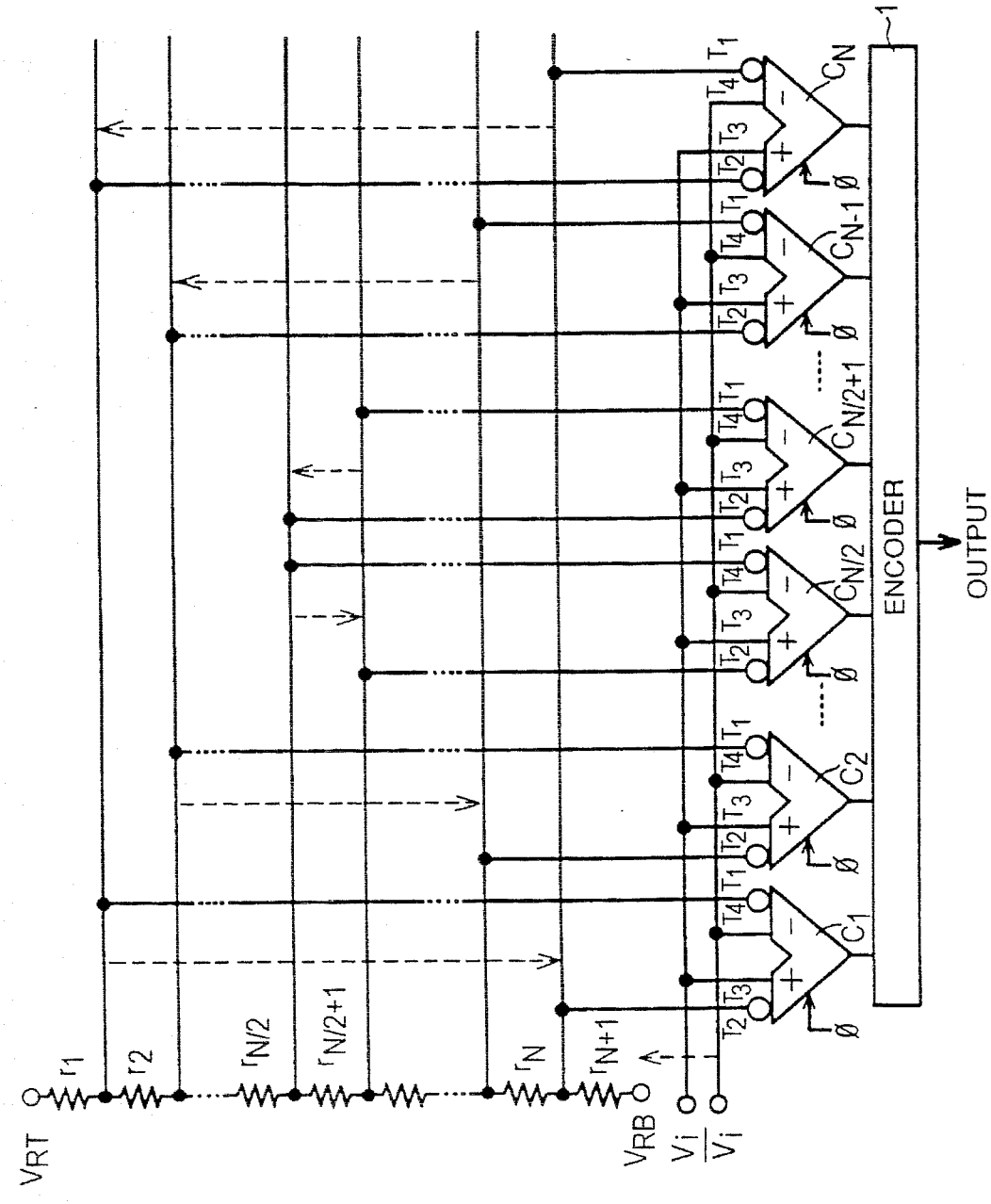
FIG. 4 is a circuit diagram showing a conventional A/D converter.

FIG. 1 is a diagram showing an arrangement according to one embodiment of the invention. The electrical configuration of the A/D converter shown in FIG. 1 is substantially identical to that in FIG. 4 except for different arrangement of voltage comparators $C_1$–$C_N$ and ladder resistors $r_1$–$r_{N+1}$ and wiring therefor. More specifically, voltage comparators $C_1$–$C_{N/2}$ and $C_{N/2+1}$–$C_N$ are arranged in two rows with their inputs opposing to each other, ladder resistors $r_1$–$r_{N/2}$ and $r_{N+1}$–$r_{N-m}$ are arranged in two rows, and ladder resistor $r_{N/2+1}$ is connected between ladder resistors $r_{N/2}$ and $r_{N-m}$. Thus arranging voltage comparators $C_1$–$C_N$ and ladder resistors $r_1$–$r_{N+1}$ in two rows permits efficient wiring for intermediate taps and reduces the area occupied by the chip.

More specifically, voltage comparators $C_1$ and $C_N$ connected to a first intermediate tap which is a connection point for ladder resistors $r_1$, $r_2$ and an N-th intermediate tap which is a connection point for ladder resistors $r_N$ and $r_{N+1}$, respectively have their input terminals $T_1$ and $T_2$ facing opposite to each other, and therefore a wiring pattern connecting each intermediate tap and a terminal can be connected at a minimum distance, resulting in efficient wiring. Since the other voltage comparators $C_2$–$C_{N/2}$ and $C_{N-1}$–$C_{N/2+1}$ face opposite to each other, respectively, patterns connecting the second to (N/2)-th intermediate taps and the (N-1)-th to (N-m)-th intermediate taps with respective terminals can be reduced.

Figure 2:
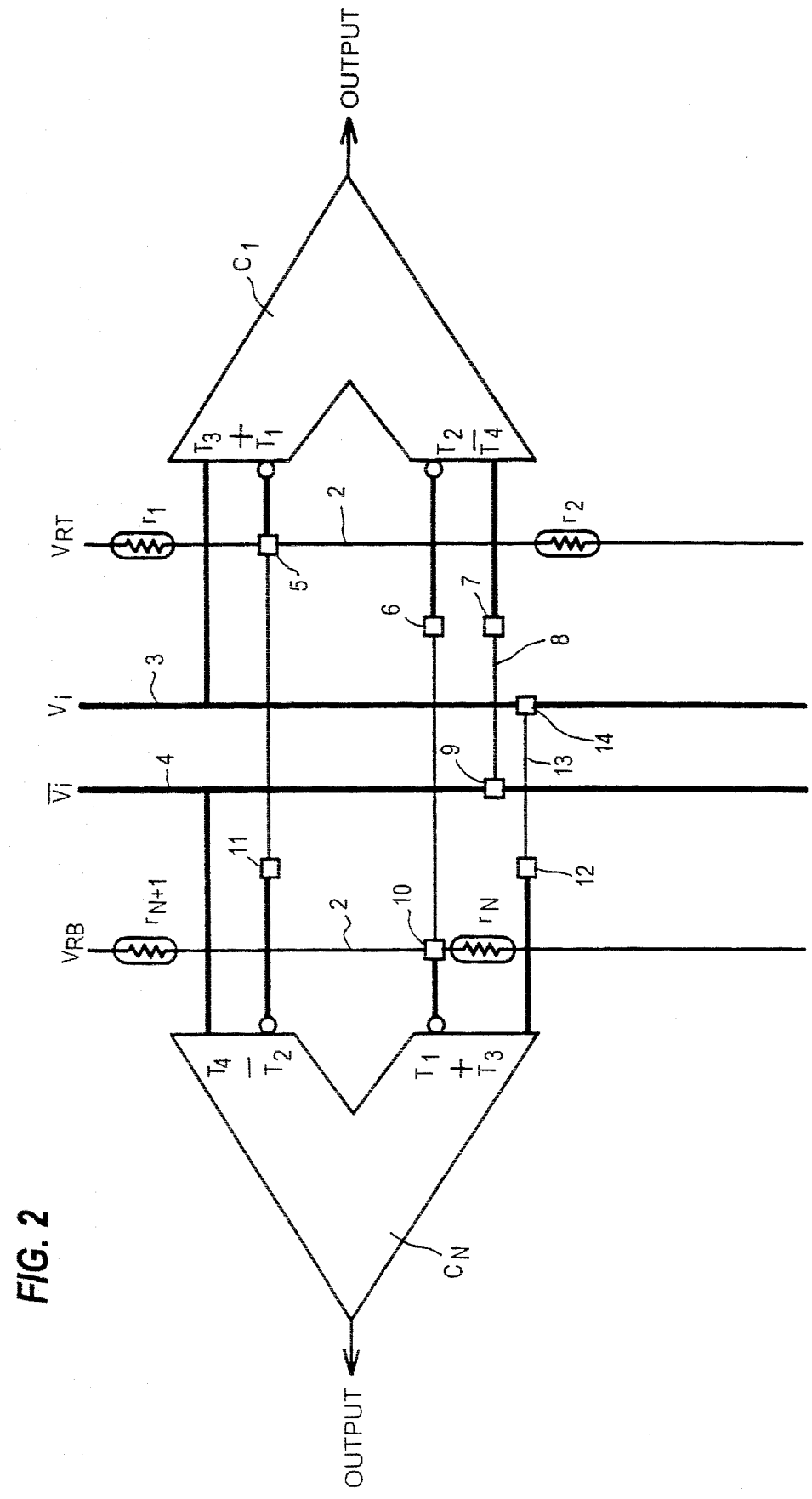
FIG. 2 is a diagram showing part of a wiring pattern placement in the A/D converter shown in FIG. 1.

FIG. 2 is a diagram showing part of the pattern arrangement of the A/D converter shown in FIG. 1. In FIG. 2, the semiconductor substrate includes first and second layers, and polysilicon resistor layers to be ladder resistors $r_1$, $r_2$–$r_N$, and $r_{N+1}$ and a pattern 2 indicated in thin line connecting ladder resistors are formed on the first layer. Formed on the second layer are voltage comparators $C_1$ and $C_N$ and patterns 3 and 4 in solid line for supplying differential input voltages $V_i$, $\overline{V}_i$. The pattern of the input terminal $T_1$ of voltage comparator $C_1$ is connected to a pattern connecting ladder resistors $r_1$ and $r_2$ in the first layer by a through hole 5, and input terminal $T_2$ is connected to a pattern connecting ladder resistors $r_{N+1}$ and $r_N$ in the second layer by a through hole 6, input terminal $T_3$ is connected to pattern 3 on the second layer, and input terminal $T_4$ is connected to pattern 8 in the first layer by a through hole 7 through a pattern extending in the horizontal direction on the second layer and is further connected to pattern 4 for differential input voltage $\overline{V}_i$ on the second layer by a through hole 9.

Similarly, the input terminal $T_1$ of voltage comparator $C_N$ is connected to the pattern connecting ladder resistors $r_{N+1}$ and $r_N$ on the first layer through a through hole 10, input terminal $T_2$ is connected to the pattern connecting ladder resistors $r_1$, $r_2$ on the first layer through a through hole 11, input terminal $T_3$ is connected to a pattern 13 on the first layer through a through hole 13, and is further connected to pattern 3 for differential input voltage $V_i$ on the second layer through a through hole 14, and input terminal $T_4$ is connected to pattern 4 on the second layer. The other voltage comparators have the same pattern arrangement.

As can be seen from FIG. 2, the pattern for connecting the respective input terminals $T_1$–$T_4$ of voltage comparators $C_1$ and $C_N$ with the patterns for the intermediate taps of the ladder resistors and differential input voltages $V_i$ and $\overline{V}_i$ can established at a minimum distance, and therefore it is not necessary to extend the pattern, thus resulting in efficient wiring and reduction of the area occupied by the chip.

Figure 3:
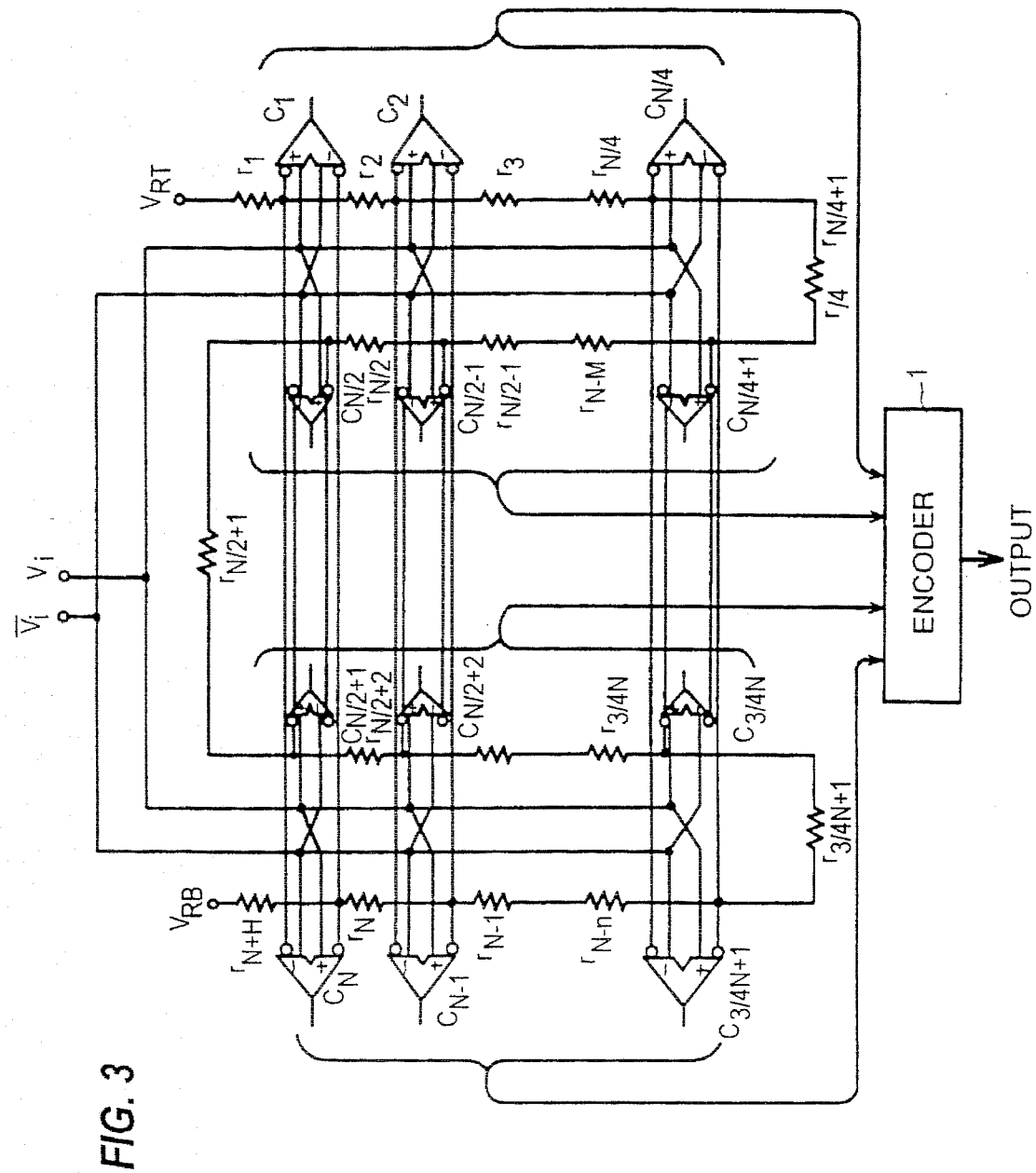
FIG. 3 is a diagram showing another embodiment of the invention.

FIG. 3 is a diagram showing another embodiment of the invention. The embodiment shown in FIG. 3 includes an arrangement of voltage comparators $C_1$–$C_N$ and ladder resistors $r_1$–$r_{N+1}$ in 2 n rows (n is a positive integer), e.g. in 4 rows, and individual line connecting patterns are the same as those in FIG. 1. In the embodiment shown in FIG. 3, for an A/D converter having a larger resolution, in other words if N is large, the row of voltage comparators can be arranged in a form close to a square.

As in the foregoing, according to the embodiments of the invention, voltage comparators are separated into two rows and arranged in a folded manner, and therefore the disadvantages associated with a conventional structure that increase in wiring and area occupied by the chip can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An A/D converter comprising:

a ladder of (N+1) resistors connected in series provided with first, second to N-th intermediate taps at respective connection points and having one end provided with a first reference voltage ($V_{RT}$) and the other end provided with a second reference voltage ($V_{RB}$); and first, second to N voltage comparators for comparing a first differential reference voltage obtained by dividing said first and second reference voltages by said ladder resistors and a second differential reference voltage formed of third and fourth voltages ($V_i$, $\overline{V}_i$), wherein said first, second to N-th voltage comparators each include first to fourth input terminals, the respective first input terminals are connected to said first, second to N-th intermediate taps, the respective second input terminals are connected to said N-th, (N-1)-th to first intermediate taps, the respective third input terminals are connected together and supplied with said third voltage, the respective fourth input terminals are connected together and supplied with said fourth voltage wherein said first, second to N-th voltage comparators are arranged in 2n rows (n is a positive integer greater than one) in a folded manner.

2. An A/D converter comprising:

a ladder of (N+1) resistors connected in series provided with first, second to N-th intermediate taps at respective connection points and having one end provided with a first reference voltage ($V_{RT}$) and the other end provided with a second reference voltage ($V_{RB}$); and first, second to N voltage comparators for comparing a first differential reference voltage obtained by dividing said first and second reference voltages by said ladder resistors and a second differential reference voltage formed of third and fourth voltages ($V_i$, $\overline{V}_i$), wherein said first, second to N-th voltage comparators each include first to fourth input terminals, the respective first input terminals are connected to said first, second to N-th intermediate taps, the respective second input terminals are connected to said N-th, (N-1)-th to first intermediate taps, the respective third input terminals are connected together and supplied with said third voltage, the respective fourth input terminals are connected together and supplied with said fourth voltage, and said first to (N/2)-th voltage comparators and said (N/2+1)-th to N-th voltage comparators are arranged in two rows in a folded manner; said A/D converter further comprising first and second semiconductor substrates, said ladder resistors being arranged at said first semiconductor substrate, at said second semiconductor substrate, said voltage comparators and a wiring pattern for supplying said third and fourth voltage being arranged in parallel;

a pattern for conducting said third and fourth voltages to the third and fourth input terminals of each said voltage comparator; and a coupling electrode for coupling the pattern for conducting to said third and fourth input terminals and the intermediate taps for the ladder resistors on said first semiconductor substrate.

3. An A/D converter comprising:

a ladder of (N+1) resistors connected in series provided with first, second to N-th intermediate taps at respective connection points and having one end provided with a first reference voltage ($V_{RT}$) and the other end provided with a second reference voltage ($V_{RB}$); and first, second to N voltage comparators for comparing a first differential reference voltage obtained by dividing said first and second reference voltages by said ladder resistors and a second differential reference voltage formed of third and fourth voltages (Vi, $\overline{V_i}$), wherein said first, second to N-th voltage comparators each include first to fourth input terminals, the respective first input terminals are connected to said first, second to N-th intermediate taps, the respective second input terminals are connected to said N-th, (N−1)-th to first intermediate taps, the respective third input terminals are connected together and supplied with said third voltage, the respective fourth input terminals are connected together and supplied with said fourth voltage, and said first, second to N-th voltage comparators are arranged in 2n rows (n is a positive integer greater than one) in a folded manner; said A/D converter further comprising first and second semiconductor substrates, said ladder resistors being arranged at said first semiconductor substrate, at said second semiconductor substrate, said voltage comparators and a wiring pattern for supplying said third and fourth voltage being arranged in parallel;

a pattern for conducting said third and fourth voltages to the third and fourth input terminals of each said voltage comparator; and a coupling electrode for coupling the pattern for conducting to said third and fourth input terminals and the intermediate taps for the ladder resistors on said first semiconductor substrate.

* * * * *